United States Patent
Steiner et al.

(10) Patent No.: US 6,356,068 B1
(45) Date of Patent: Mar. 12, 2002

(54) CURRENT MONITOR SYSTEM AND A METHOD FOR MANUFACTURING IT

(75) Inventors: Ralph Steiner, Marthalen; Michael Schneider, Constance; Felix Mayer, Zurich, all of (CH)

(73) Assignee: AMS International AG, Unterpremstatten (CH)

( * ) Notice: Subject to any disclaimer, the term of this patent is extended or adjusted under 35 U.S.C. 154(b) by 0 days.

(21) Appl. No.: 09/308,079

(22) PCT Filed: Sep. 11, 1998

(86) PCT No.: PCT/IB98/01401

§ 371 Date: May 12, 1999

§ 102(e) Date: May 12, 1999

(87) PCT Pub. No.: WO99/14605

PCT Pub. Date: Mar. 25, 1999

Related U.S. Application Data

(60) Provisional application No. 60/058,898, filed on Sep. 15, 1997.

(51) Int. Cl.[7] .............................................. G01R 33/07

(52) U.S. Cl. ................................ 324/117 H; 324/158.1

(58) Field of Search ......................... 324/117 H, 117 R, 324/207.21, 249, 252

(56) References Cited

U.S. PATENT DOCUMENTS

| | | |
|---|---|---|
| 5,041,780 A | 8/1991 | Rippel |
| 5,500,590 A * | 3/1996 | Pant ............................ 324/252 |
| 5,912,556 A * | 6/1999 | Fraze et al. ............. 324/207.21 |
| 5,952,819 A * | 9/1999 | Bercan et al. ........... 324/117 R |
| 5,969,517 A * | 10/1999 | Rao ............................. 324/96 |
| 6,069,029 A * | 5/2000 | Murakami et al. ........... 438/123 |
| 6,100,580 A * | 7/2000 | Murakami et al. ........... 257/666 |

FOREIGN PATENT DOCUMENTS

| | | |
|---|---|---|
| DE | 3828005 | 3/1989 |
| WO | WO95/25959 | 9/1995 |

OTHER PUBLICATIONS

Andrä W et al: "Current Measurement based on Thin–Film Magnetoresistive Sensors" Sensors and Actuators A, vol. A37–A38, Jun. 1, 1993, pp. 461–465, XP000411429 see abstract; figures 3, 4 see p. 462, left–hand column, paragraph 1—p. 463, left–hand column, paragraph 1.*
Patent Abstracts of Japan vol. 017, No. 242 (P–1535), May 14, 1993 & JP 04 364472 A (FUJI Electric Co. Ltd), Dec. 16, 1992 see abstract.*
Patent Abstracts of Japan vol. 010, No. 250 (P–491), Aug. 28, 1986 & JP 61 080074 A (Toshiba Corp), Apr. 23, 1986 see abstract.*
EP 0 537 419 A (Landis & Gyr Business Support) Apr. 21, 1993 see abstract; figures see col. 3, line 11—Col. 4, line 43.*
EP 0 772 046 A (Sentron Ag) May 7, 1997 see col. 4, line 40—col. 5, line 50; figures 6,7.*
DE 41 41 386 A (ITT Ind GMBH Deutsche) Jun. 17, 1993 see col. 1, line 45—line 48; figures 2A, 2B see col. 2, line 25—line 61.*

(List continued on next page.)

Primary Examiner—Safet Metjahic
Assistant Examiner—T. R. Sundaram
(74) Attorney, Agent, or Firm—Oppedahl & Larson LLP

(57) ABSTRACT

A fully packaged current monitor system for galvanically isolated current measurement is manufactured in line with commercial IC fabrication and LOC packaging technology. A current path is part of the lead frame on which a die with sensor means is mounted with the aid of an electrically insulating correspondingly pre-patterned glue tape, the structured surface of the die facing the lead frame. The system manufactured in this way achieves for currents up to +/−10 A, a system accuracy of better than 50 mA and is applicable for currents up to the order of 50 A. The system performance can be further improved by ferromagnetic field concentrators and on-chip compensation techniques.

13 Claims, 7 Drawing Sheets

OTHER PUBLICATIONS

W.P. Taylor, M. Schneider, H. Baltes, and M.G. Allen, "Electroplated Soft Magnetic Materials for Microsensors and Microactuators," *Transducers 97*, 1997, vol. 2, pp. 1445–1448.

R. Steiner, Ch. Maier, A. Hàberli, F.–P. Steiner, H. Baltes, "Offset Reduction in Hall Devices by Continuous Spinning Current Method," (reprint), *Sensors and Actuators A: Physical*, Elsevier, 1998, pp. 167–172.

* cited by examiner

CURRENT MONITOR SYSTEM AND A METHOD FOR MANUFACTURING IT

This application claims benefit of provisional No. 60/058,898 filed Sep. 15, 1997.

FIELD OF THE INVENTION

The invention is in the field of galvanically isolated current measurement and concerns a fully packaged integrated current monitor system and a method for manufacturing such encapsulated micro systems.

BACKGROUND OF THE INVENTION

A convenient principle of galvanically isolated current measurement is the detection of the magnetic field generated by a current. This magnetic field is e.g. measured with the aid of a Hall sensor which is e.g. integrated on a semiconductor substrate. Such systems are e.g. fully packaged in an IC-housing containing a die with integrated sensor means and a current path for the current to be monitored.

The publications DE-3828005 and WO-95/25959 describe systems according to the above principle in which the die with the integrated sensor means is mounted on a chip support. This chip support consists of an electrically conducting material and extends out of the IC-housing and is used as a path for a current to be measured. These systems are applicable for measurements in a large current range. However, the shape of the chip support (and consequently the current path) is dictated by its mechanical supporting function. Due to this constraint, the chip support cannot be optimized for its function as current path and therefore, an only limited sensitivity can be achieved. Furthermore, there is always the semiconductor substrate and an additional insulating layer between the current path and the chip with the magnetic sensor, i.e. a distance of approximately 0.7 mm between the current path and the sensor means. As the magnetic field generated by the current decreases drastically with the distance from the current path the sensitivity of the system is further limited.

The publication WO-95/25959 also suggests to integrate the current path on the structured surface of the die close to the integrated magnetic sensors. Such a system can be packaged and contacted in exactly the same way as any conventional die. However, besides increasing the size of the die and therewith the cost of the die, the measuring range of the system is greatly reduced compared with the measuring range of a system in which the chip support serves as current path.

Regarding the measuring range, the same applies to the system as described in the publication U.S. Pat. No. 5,041,780 in which the current path is realized as an additional structured metallic layer deposited on the structured surface of the die containing the integrated magnetic sensors. Such a current path is structured for optimum relative positioning of the magnetic sensors and current path and allows positioning of the sensors considerably closer to the current path (high measuring sensitivity) than other systems. However, manufacturing the die needs additional manufacturing steps (deposition and structuring of additional layers) which add to the overall costs of the die.

It shows that all the known fully packaged systems for current monitoring and the methods for manufacturing them have their drawbacks regarding either measuring range or measuring sensitivity or cost. This means that the state of the art does not allow to manufacture a low cost system having at the same time a very large measuring range and a very high measuring sensitivity.

SUMMARY OF THE INVENTION

One object of the invention is to provide a fully packaged current monitor system for galvanically isolated current measurements which system is encapsulated within an IC-housing and comprises integrated magnetic sensor means with corresponding electronics and an electrically conducting path for the current to be measured and which system avoids the above-described shortcomings of the prior art devices, i.e. covers a large current range with high sensitivity and can still be manufactured at substantially the same or even lower costs than the known devices.

Another object of the invention is to show a method for low cost manufacturing of the inventive fully packaged current monitor system for galvanically isolated current measurement.

This object is achieved by the system and the method as defined in the claims.

The inventive system covers a current range up to 50 A for the current to be measured. Furthermore, high measuring accuracy and high sensitivity is achieved due to a very small distance between magnetic sensors and the path of the current to be monitored. The inventive system can be manufactured using state-of-the-art equipment, in a minimum of manufacturing steps and with no special adaptation of the equipment. Therefore, high volume and low cost manufacturing is ensured.

The novel structure and the inventive method of manufacturing are based on the idea of modifying a standard lead frame by short cutting two or more leads to form a current path. This current path of the modified lead frame together with the leads for electrical interconnection serve as chip support on which the die is mounted. Thereby, the die is mounted with the integrated magnetic sensors and the bonding pads towards the current path and the leads whereby lead-on-chip packaging technology (LOC) is used. The necessary glue tape for the LOC packaging technology additionally serves as insulating layer between current path and sensor die to ensure a high breakdown voltage required for galvanically isolated current measurements. This packaging sequence is preferable carried out on a commercial LOC die bonder.

The inventive current monitor system shows very low power dissipation in the path for the current to be measured. Therefore, the system is applicable for currents up to 50 A without exceeding the operating temperature of the integrated magnetic sensors. Due to the perfect insulation between the current path and the die with the integrated magnetic sensors a breakdown voltage in the order of several kV is achieved. The system response in a current range of ±10 A exhibits a small non-linearity below ±0.3%. This results in an absolute measurement accuracy better than 50 mA (sensitivity in the order of 0.1 mV/A, resolution in the order of 10 mA). The performance can be further improved by soft ferromagnetic field concentrators.

Above all, the inventive manufacturing method of the current monitor system can be realized with well known and established equipment (in particular a LOC die bonder, a wire bonder, and equipment for plastic molding). The manufacturing flow requires neither an additional process step nor an adaptation of the equipment compared with the manufacturing flow of packaging a conventional die.

Generally spoken, the inventive method comprises the steps of:
  providing a die with integrated magnetic sensors, optional integrated electronics, and bonding pads for external electrical connection, providing a lead frame comprising a frame, leads for electrical connection to the bonding pads attached to the frame, and a current path formed by short cutting at least two leads, mounting the lead frame onto the structured side of the die by connecting the free ends of the leads and the current path to the structured side of the die with the aid of electrically insulating connecting means placed between areas of the lead frame and the die to be connected, connecting by wire bonding the bonding pads of the die to the leads of the lead frame indented for electrical interconnection, encapsulating the die and the parts of the lead frame connected to the die in an IC-housing, and trimming off the frame of the lead frame.

The electrically insulating connecting means advantageously consist of a glue tape as used in lead-on-chip or LOC packaging technology. Such glue tape usually consists of three polymer layers, whereby the outer layers have a lower adhesive glass transition temperature than the center layer. For the step of connecting, the tape is brought to a temperature above the lower adhesive glass transition temperature of the outer layers and below the adhesive glass transition temperature of the center layer and the parts to be connected are pressed together. Using such connecting means ensures an insulating layer having a defined thickness between parts of the lead frame and the die. Glue tapes as used in LOC packaging technology give an insulating layer having a typical thickness of e.g. 0.05 mm to 0.1 mm.

For the step of mounting the lead frame on the die, a known and well established LOC die bonder can be used without any special materials or settings. The LOC packaging technique is widely used for assembling memory cells to increase the ratio of die size to overall packaging dimensions. Thanks to this application LOC technology has become a way of inexpensive and reliable high volume production packaging, which according to the invention is newly open for producing current monitor systems.

Advantageously, the magnetic sensors are Hall sensors sensitive perpendicular to the die surface and for maximum sensitivity they are positioned in locations of maximum magnetic amplitude perpendicular to the die surface, i.e. with the center of the sensitive plane of the sensors near the longitudinal edge of the current path.

BRIEF DESCRIPTION OF THE FIGURES

Exemplified embodiments of the inventive system and the inventive method are described in more detail in connection with the following Figures, wherein.

DESCRIPTION OF THE PREFERRED EMBODIMENTS

Figure 1:
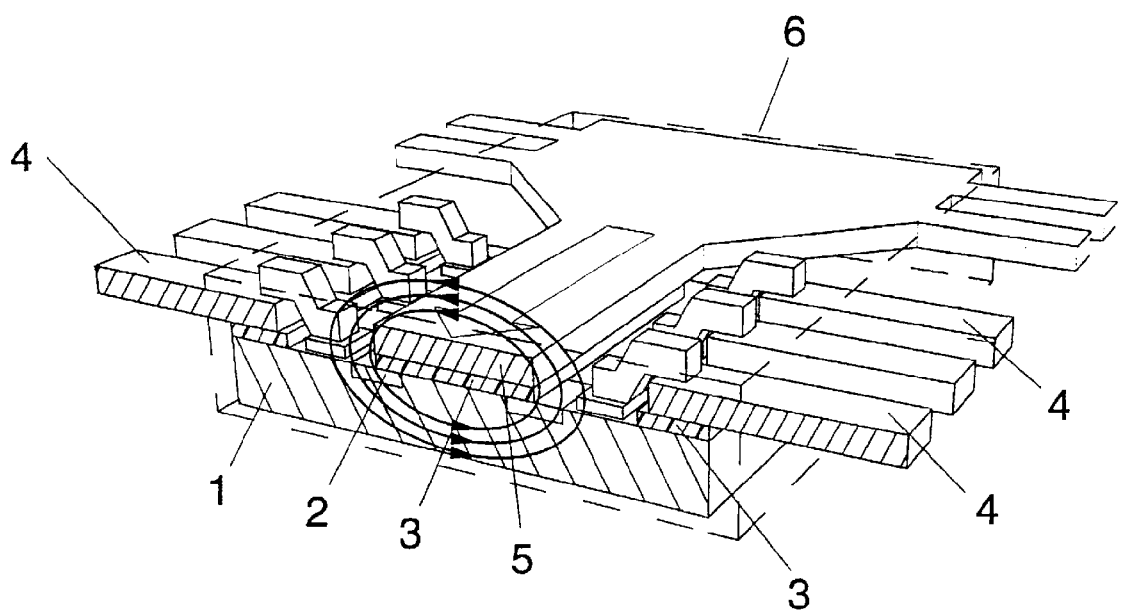
FIG. 1 shows an exemplified embodiment of the inventive fully packaged current monitor system (section perpendicular to the die surface)

FIG. 1 shows schematically an exemplified embodiment of the inventive fully packaged current monitor system in a cross section perpendicular to the surface of the die 1, which is e.g. a CMOS-die. The die 1 comprises two integrated Hall sensors 2 sensitive perpendicular to the die surface. It is connected with the aid of a pre-patterned glue tape 3 to the leads 4 and the current path 5 (leads and current path being parts of the same lead frame) and encapsulated within the IC-housing 6 whose edges are shown in broken lines whereby the structured side of the die faces the parts of the lead frame.

The two CMOS Hall sensors are sensitive perpendicular to the die surface. The current path 5 and the die 1 are adapted to each other such that the centers of the sensitive planes of the integrated sensors 2 are positionable near the longitudinal edges of the current path 5 (location of maximum magnetic amplitude perpendicular to die surface). The few indicated magnetic field lines of the magnetic induction B generated by the current in the current path 5 show that the field lines are substantially perpendicular to the die surface at the sensor locations. Due to this and due to the small distance between current path and magnetic sensors, high system response and still excellent insulation is achieved.

With a biasing current of 0.25 mA the sensitivity of a single device is 510 V/AT. The Hall sensor offsets are compensated according to to values lower than 0.001 mV. The sensors are located on each side of the current path. The system response is the difference of the Hall voltages in order to reject common-mode magnetic fields.

The main advantages of the inventive fully packaged current monitor system are the following:

The leads for electrical interconnection of the sensor die and the current path of arbitrary shape are parts of the same lead frame. This lead frame fits into an industrial LOC die bonder. Therefore, inexpensive and high volume batch fabrication is provided.

Since the current path and the IC housing pins are parts of the same metal sheet a low ohmic current path to an outside current source is obtained. This results in a low power dissipation in the current path, and, therefore, in a low temperature elevation of the current path while operated. Furthermore, a better thermal connection to the IC housing pins is achieved resulting in a lower operating temperature of the current path.

The current path is positioned as close as possible to the magnetic sensors and perfectly electrically isolated by the LOC glue tape.

The leads for electrical interconnection of the sensor die and the current path are spatially separated. As a result, high breakthrough voltages are achieved.

FIGS. 2 to 7 show the steps of the inventive method for manufacturing the fully packaged current monitor system.

Figure 2:
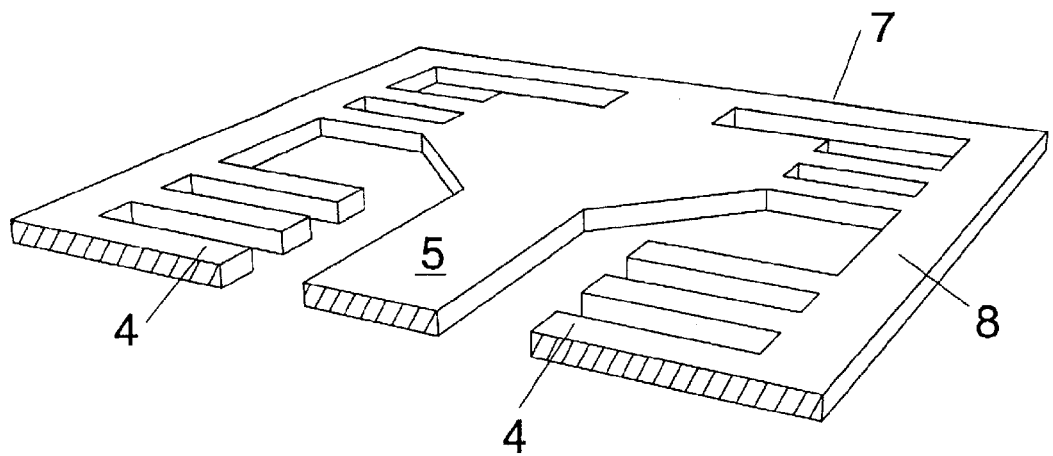
FIGS. 2 to 7 show the steps of the inventive method for manufacturing the fully packaged current monitor system.

FIG. 2 shows the lead frame 7 comprising a frame 8 and connected to the frame 8: leads 4 with free ends and a current path 5 short cutting at least two leads (only one half of the lead frame is shown).

Figure 3:
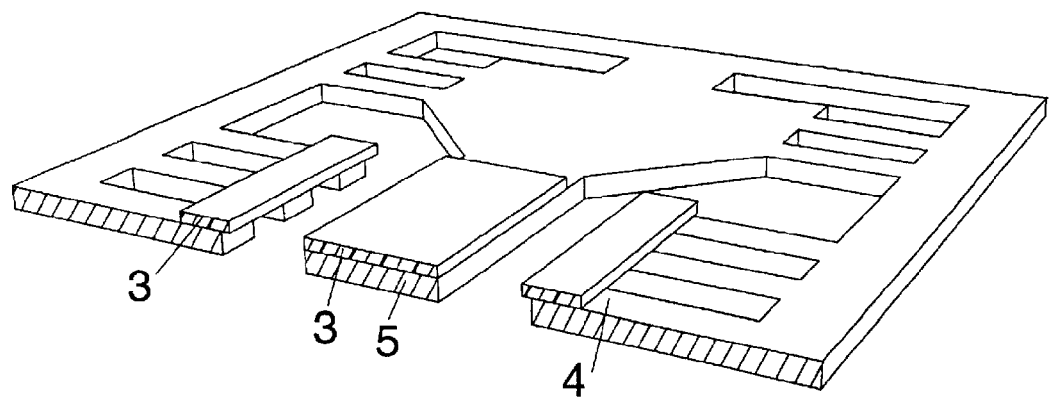

FIG. 3 shows the step of pre-patterning the glue tape 3, the pre-patterned glue tape being positioned e.g. on the free ends of the leads 4 and on the center section of the current path 5. The glue tape is e.g. ABLOC 5000 and is connected to the lead frame at 300° C. and 3 bar. This glue tape has a final thickness of 0.09 mm and a breakdown voltage of 14 kV.

Figure 4:
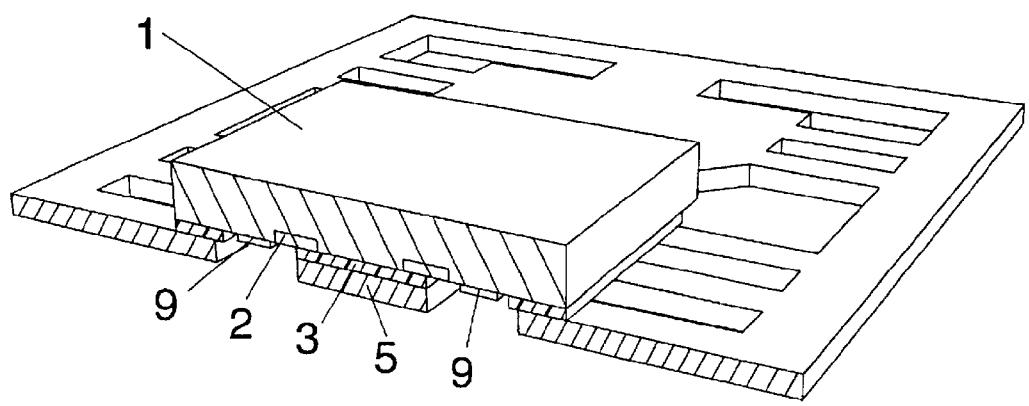

FIG. 4 shows the placing of the CMOS sensor die 1 comprising integrated magnetic sensors 2 (e.g. a pair of Hall sensors) and contact pads 9 for the integrated circuit to the glue tape 3 such that the structured surface of the die 1 is facing the glue tape. The die 1 is placed such that the integrated magnetic sensors 2 are positioned on opposite sides of the current path 5. The die 1 is fixed to the glue tape at 300° C. whereby a placing accuracy in the micrometer-range is possible.

Figure 5:
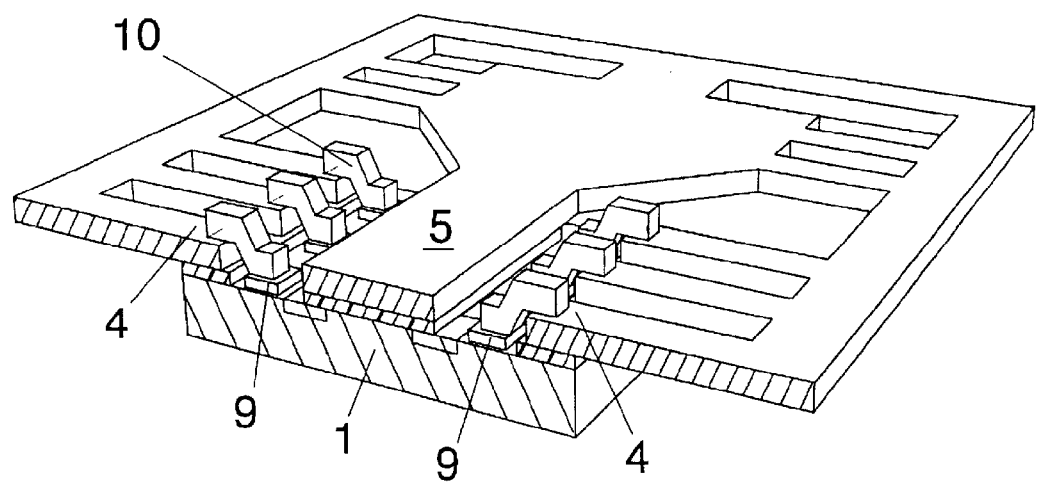

FIG. 5 shows the contacting step in which wire bonds 10 are established between the contact pads 9 and the ends of the leads 4 using a conventional wire bonder.

Figure 6:
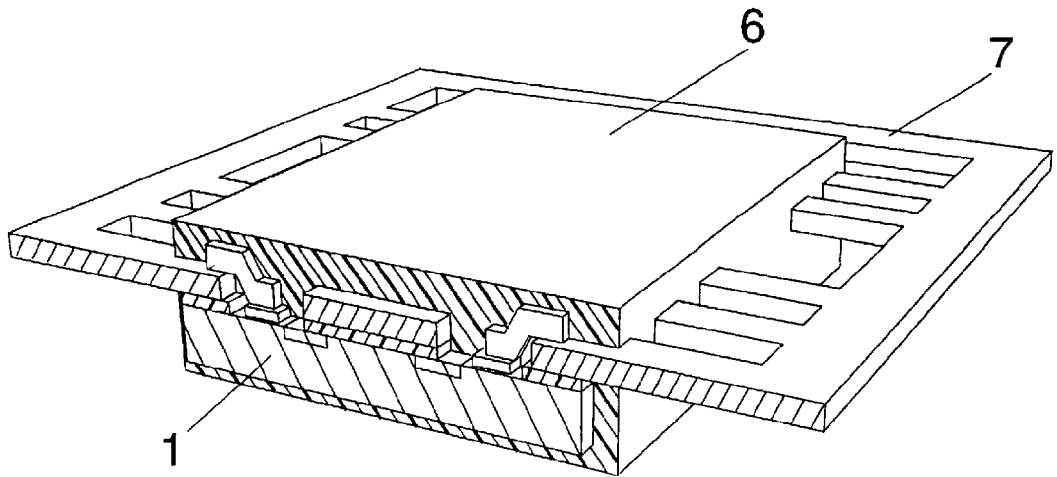

FIG. 6 shows the system after plastic molding in which step the IC-housing 6 is molded around the sensor die 1 fixed to the lead frame 7.

Figure 7:
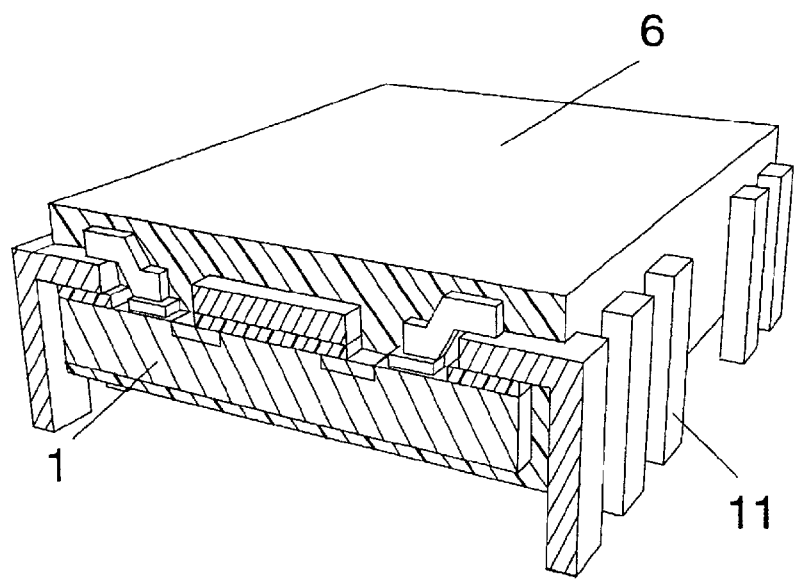

FIG. 7 shows the finished system. The frame of the lead frame is trimmed off and the contact pins 11 for contacting the sensor die and the current path are formed.

Figure 8:
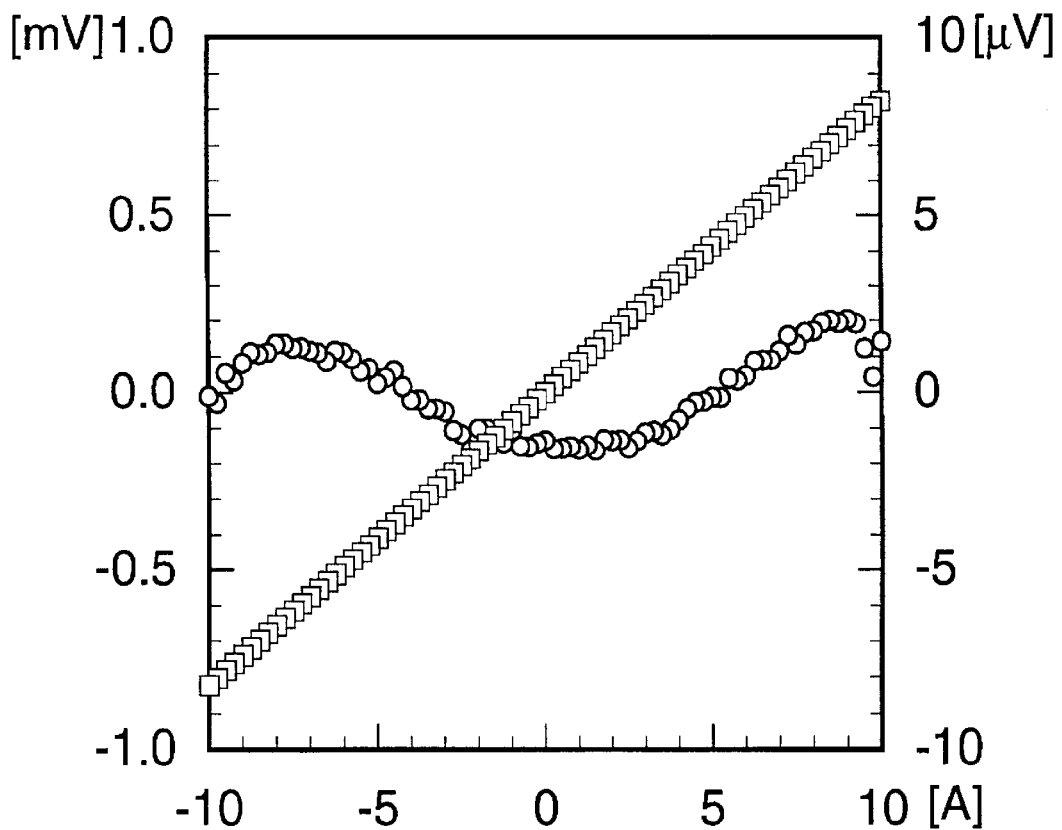
FIG. 8 shows a diagram of the measured response of the current monitor system according to FIG. 1 (system response and non-linearity versus current)

FIG. 8 shows a diagram of the measured response of the current monitor system according to FIG. 1. The system response in mV (left) and the non-linearity in $\frac{1}{1000}$ mV are plotted versus the current (range −10 A to +10 A). The signal is linear with a sensitivity of 0.082 mV/A. The non-linearity is smaller than ±0.3% and the signal offset lies below 0.002 mV. Linearity, offset and noise result in a measurement accuracy better than 50 mA and a resolution of 10 mA. The non-linearity is mainly due to power dissipation in the current path. With temperature compensation of the Hall sensor sensitivity the system linearity can be easily improved.

Figure 9:
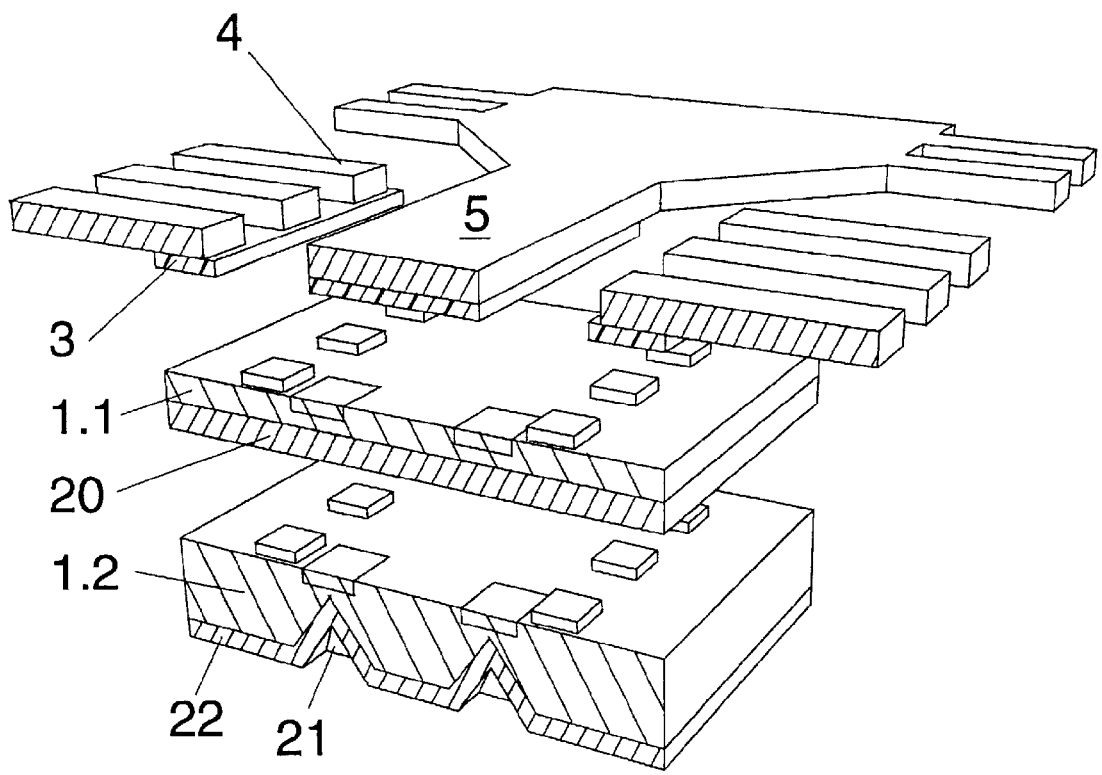
FIG. 9 shows two further exemplified embodiments of the inventive current monitor system which for sensitivity improvement comprise field concentrators on the backside of the die.

The system sensitivity can be further improved by magnetic field concentrators as shown in FIG. 9 which shows current path 5 and leads 4 of the lead frame and two CMOS dies 1.1 and 1.2 equipped with field concentrators.

The die 1.1 which was thinned to 0.075 mm carries a soft ferromagnetic sheet 20 attached to its backside. The die 1.2 comprises tip concentrators 21 fabricated by anisotropic backside-etching and plated with a soft NiFeMo alloy 22. The NiFeMo-film has a thickness of approximately 0.015 mm.

Figure 10:
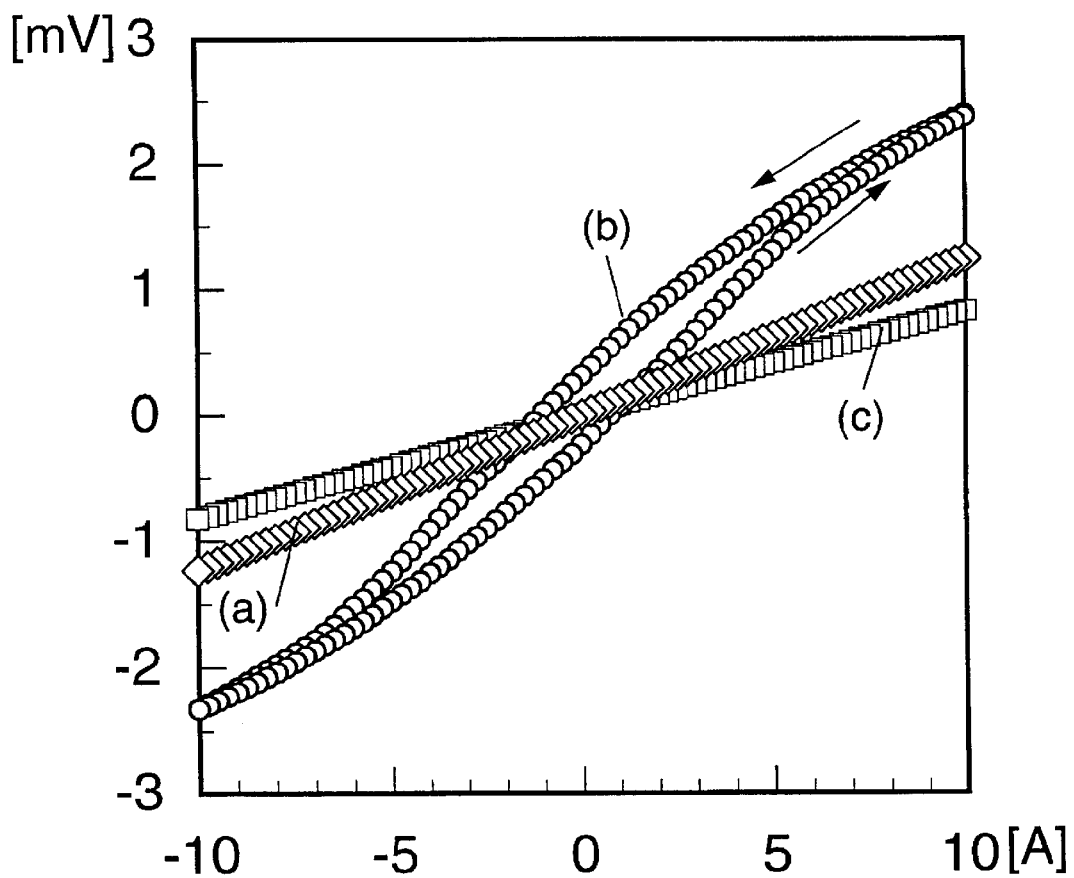
FIG. 10 shows a diagram of the measured response of the current monitor systems with field concentrators according to FIG. 9 (system response versus current).

FIG. 10 shows in a diagram of the system response versus the current the improvements achieved with the dies 1.1 and 1.2 according to FIG. 9 compared with the die 1 according to FIG. 1.

As shown by plot (a), the ferromagnetic sheet 20 of the die 1.1 improves the sensitivity by a factor of 1.5 to 0.124 mV/A without affecting non-linearity and offset of the system response. As shown by the plot (b), the tip concentrators increase the sensitivity even by a factor of 3 to 0.237 mV/A. Due to the hysteresis of this particular NiFeMo film an additional non-linearity is introduced. Plot (c) shows the system response of the system according to FIG. 1.

What is claimed is:

1. A system for galvanically insulated current measurement, comprising:
   a CMOS die having a structured surface with an integrated circuit including at least one Hall sensor and bonding pads for external connections to the integrated circuit and
   leads connectable to the bonding pads and a current path short-cutting at least two leads,
   whereby the leads and the current path are parts of the same lead frame onto which the die is mounted with its structured surface facing the lead frame and with the current path and the ends of the leads fixed to the structured surface of the die with the aid of electrically insulating connecting means,
   characterized in that the least one Hall sensor is sensitive perpendicular to the die surface and in that the longitudinal edge of the current path is positioned near the center of the sensitive plane of the at least one Hall sensor.

2. The system of claim 1, characterized in that the electrically insulating connecting means is an LOC glue tape comprising three polymer layers.

3. The system of claim 1, characterized in that the die comprises a pair of Hall sensors and in that the integrated circuit further comprises means for generating a difference of the signals of the sensors of the pair.

4. The system of claim 1, characterized in that the backside of the die is equipped with field concentrators.

5. A method for producing a fully packaged current monitor system for galvanically isolated current measurement, the method comprising the steps of:
   providing a CMOS die having a structured surface with an integrated circuit comprising at least one Hall sensor and bonding pads for external connections to the integrated circuit,
   providing a lead frame comprising a frame and connected to the frame, leads connectable with the bonding pads and a current path short cutting at least two leads,
   mounting the die onto the lead frame by connecting the free ends of the leads and the current path to the structured surface of the die with the aid of electrically insulating connecting means positioned between areas of the lead frame and of the die to be connected,
   connecting the bonding pads of the integrated circuit to the leads of the lead frame by wire bonds,
   encapsulating the die and the parts of the lead frame connected to the die in an IC-housing, and
   trimming off the frame of the lead frame,
   characterized in that the step of providing a die comprises manufacturing with the aid of CMOS-technique at least one Hall sensor sensitive perpendicular to the die surface.

6. The method of claim 5, characterized in that the step of providing a die comprises manufacturing a pair of Hall sensors and means for generating a difference of the signals of the sensors of the pair.

7. The method of claim 5, characterized in that the step of mounting the die comprises positioning as a connecting means a patterned glue tape between the lead frame and the die.

8. The method of claim 5, characterized in that the step of mounting the die on the lead frame is carried out with a known LOC die bonder.

9. The method of claim 5, characterized in that the step of providing the die comprises manufacturing means for temperature compensation of the sensor signals.

10. The method of claim 5, characterized in that the step of providing the die comprises attaching a soft ferromagnetic sheet to the backside of the die.

11. The method of claim 5, characterized in that the step of providing the die comprises fabricating tip concentrators on the backside of the die by anisotropic etching and plating with a soft NiFeMo-alloy.

12. A system for galvanically insulated current measurement, comprising:
   a CMOS die with a structured surface, the structured surface having at least one integrated Hall sensor and bonding pads wire-bonded to leads and a current path for carrying the current to be measured,
   wherein the leads and the current path are part of the same lead frame,
   wherein the leads and the current path are mounted to the structured side of the die with the aid of LOC glue tape, and wherein the die is encapsulated in an IC-housing the leads and the ends of the current path penetrating to the outside of the housing, characterized in that the least one Hall sensor is sensitive perpendicular to the die surface and in that the longitudinal edge of the current path is positioned near the center of the sensitive plane of the at least one Hall sensor.

13. A method for producing a fully packaged current monitor system for galvanically isolated current measurement, the method comprising the steps of:

providing a CMOS die having a structured surface with an integrated circuit comprising at least one Hall sensor and bonding pads for external connections to the integrated circuit, providing a lead frame comprising a frame and connected to the frame, leads connectable with the bonding pads and a current path between at least two leads, mounting the die onto the lead frame by connecting the free ends of the leads and the current path to the structured surface of the die with the aid of electrically insulating connecting means positioned between areas of the lead frame and of the die to be connected, mounting the leads and the current path to the structured side of the die with the aid of LOC glue tape, connecting the bonding pads of the integrated circuit to the leads of the lead frame by wire bonds, encapsulating the die and the parts of the lead frame connected to the die in an IC-housing, and trimming off the frame of the lead frame, characterized in that the step of providing a die comprises manufacturing with the aid of CMOS-technique at least one Hall sensor sensitive perpendicular to the die surface.

* * * * *